United States Patent [19]

Kanatani et al.

[11] 4,024,389
[45] May 17, 1977

[54] PHOTO-IMAGE MEMORY PANEL AND ACTIVATING METHOD THEREFOR

[75] Inventors: Yoshiharu Kanatani; Masahiro Ise; Etsuo Mizukami, all of Tenri, Japan

[73] Assignee: Sharp Kabushiki Kaisha, Osaka, Japan

[22] Filed: Aug. 7, 1975

[21] Appl. No.: 602,669

Related U.S. Application Data

[62] Division of Ser. No. 478,614, June 12, 1974.

[30] Foreign Application Priority Data

June 15, 1973 Japan .............................. 48-68118
June 15, 1973 Japan .............................. 48-68119

[52] U.S. Cl. .......................... 250/213 R; 313/509
[51] Int. Cl.² ................................. H01J 31/50
[58] Field of Search .... 250/213 R, 213 A, 213 VT, 250/211 R; 340/173 LM, 173 LS, 173 LT; 331/94.5; 313/485, 498, 506, 507, 508, 509

[56] References Cited

UNITED STATES PATENTS

| | | | |
|---|---|---|---|
| 3,169,192 | 2/1965 | Kohashi | 250/213 R |
| 3,548,214 | 12/1970 | Brown | 250/213 R |
| 3,644,741 | 2/1972 | Ovshinsky | 340/173 LS |
| 3,699,374 | 10/1972 | Scholl et al. | 250/213 R |
| 3,711,719 | 1/1973 | Szepesi | 313/485 |

*Primary Examiner*—David C. Nelms
*Attorney, Agent, or Firm*—Birch, Stewart, Kolasch and Birch

[57] ABSTRACT

Disclosed is a photo-image memory panel composed of an electroluminescent element which exhibits electrical polarization effects upon light excitation. Under the conditions when the panel is biased by DC voltage or DC offset voltage, light irradiation is applied to the panel to establish a light-activated polarized electric field of which the intensity is controllable in dependence upon a photo-image desired to be written into the panel. Then, the photo-image written into the panel is held while maintaining the polarized electric field. Thereafter, application of a predetermined voltage pulse enables the reading out of the photo-image in the form of light emission. Alternatively, in case of an electroluminescent element of which the light emission versus applied voltage characteristics involve the hysteresis phenomenon, a train of alternating current pulses are employed as reading-out pulses to maintain light emission corresponding to the read-out image.

12 Claims, 12 Drawing Figures

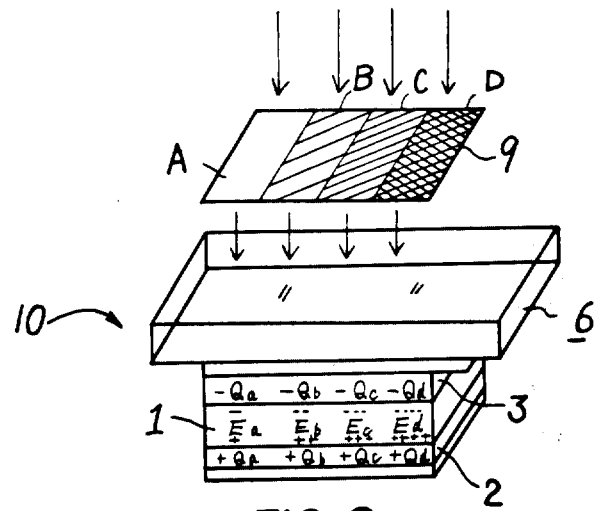
FIG. 8
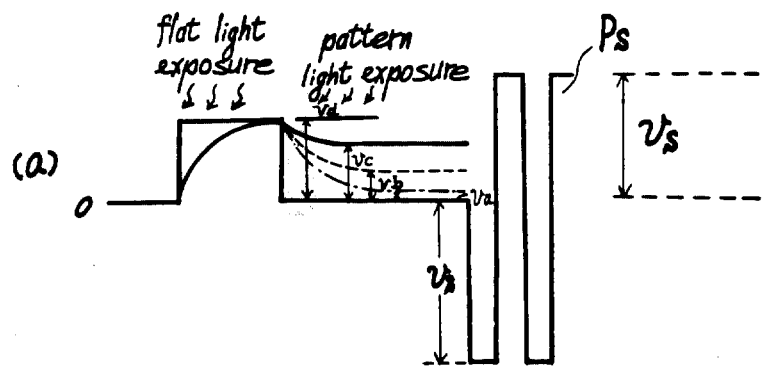
FIG. 12
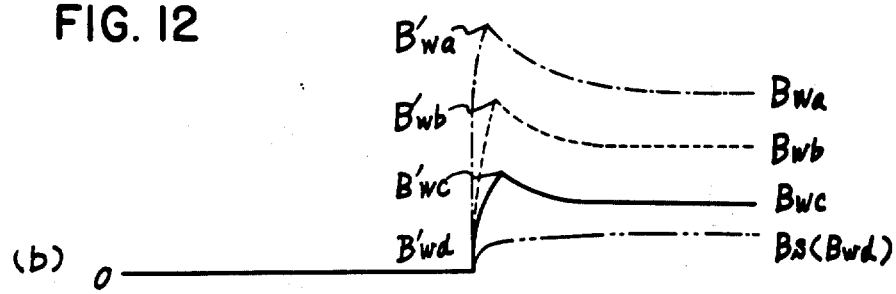

4,024,389

PHOTO-IMAGE MEMORY PANEL AND ACTIVATING METHOD THEREFOR

This is a division of application Ser. No. 478,614 filed June 12, 1974.

BACKGROUND OF THE INVENTION

The present invention relates to an electro-optical device composed of an electroluminescent element exhibiting light-excited polarization effects and a method for activating the electro-optical device for the purpose of the writing, storing and reading of a desired photo-image.

It is well known, for example, in the xerography art that an electro-optical construction wherein a photoconductive layer sandwiched between two dielectric layers exhibit electrical polarization effects. Nevertheless, such an electro-optical device shows no capability of self displaying an electrically polarized latent image written into therein and thus for example the xerography art needs toner means.

SUMMARY OF THE INVENTION

The novel devices are made possible by the inventors' discovery that in electroluminescent elements of a type having an electroluminscent layer sandwiched by a pair of dielectric layers, when biased by a DC voltage or DC offset voltage, electrical polarization of electrostatic charge occurs in the interfaces between the electroluminescent layer and the dielectric layers upon activation by the light inventors have experimentally confirmed that a light-excited electrically polarized electric field exists in such an electroluminscent layer. This phenomenon is called "light-excited electrical polarization effects" herein. In addition, when no voltage is applied to the electroluminescent element, the thus formed polarized electric field is alleviated upon external application of light irradiation. The latter phenomenon is called "light excited electrical depolarization effects" hereinafter. The inventors have devised as typical EL elements of the type briefly discussed above sandwich construction elements which comprise a thin film of ZnS (Mn, namely, doped with Mn) and a pair of dielectric films.

In addition, as generally known in the art, such EL elements more specifically ZnS thin film EL elements show excellent electroluminescence in response to an electric field higher than a threshold level. In recent years, considerable effort has, therefore, been directed toward the development of a display panel or element which comprises an electroluminescent layer made of ZnS thin film. As the results of researches on phenomena occurring on the ZnS thin film EL elements, the novel photo-image storage panel and driving method therefor have been developed, which is capable of memorizing light-excited electrically polarized latent images written thereto and self displaying such latent images upon pulse excitation.

Accordingly, it is an object of the present invention to provide a new electro-optical device capable of memorizing a desired photo-image applied thereto and displaying such image in the form of luminescence by utilization of the light-excited electrical polarization effects.

It is another object of the present invention to provide a method for activating the new electro-optical device by utilization of the light-excited electrical polarization effects and light-excited electrical depolarization effects when a desired image is written into the electro-optical device.

It is still another object of the present invention to provide a method for driving an image storage panel for displaying in the form of luminescence a latent image stored in the panel.

In order to achieve the above-mentioned objects, pursuant to the teachings of the present invention, light exposure is applied to a panel composed of a ZnS (Mn) electroluminescent element with a sandwich construction when in DC biased conditions so that a light-excited polarized electric field occurs within the electroluminescent element, the intensity of the polarized electric field being controllable in dependence upon an image desired to be written and stored into the panel. Thereafter, predetermined read out pulses applied to the panel cause light outputs corresponding to the internally polarized electric field to develop so as to display the latent image written into the panel. In case of EL elements having the light intensity versus applied voltage characteristics including the hysteresis properties inherent in the sandwich type EL elements, the photo-image read out from the panel can be displayed for a long period of time by means of a train of consecutive alternating current pulses.

BRIEF DESCRIPTION OF THE DRAWINGS

FIGS. 7 and 8 are illustrations of a second embodiment of the present invention;

FIGS. 11 and 12 are time charts as regards a third embodiment of the present invention.

DESCRIPTION OF THE PREFERRED EMBODIMENTS

Figure 1:
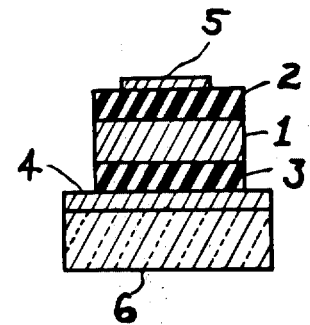
FIG. 1 is a sectional view of a sandwich construction thin film electroluminscent element.

Referring now to FIG. 1, there is illustrated a ZnS electroluminescent element exhibiting the light-excited electrical polarization effects briefly described in the above summary of the invention, which comprises an electroluminescent thin film 1 made of ZnS, etc., and a pair of dielectric layers 2, 3 made of appropriate materials $Y_2O_3$, etc. The EL element includes further a pair of electrode layers 4, 5 one being a transparent electrode made of $SnO_2$, etc., and the other being a metal rear electrode made of Al, etc. As well known in the art, the ZnS thin film 1 is doped with transition elements such as Mn, Cr or rare earth elements such as Tb, Er, Tm, Yb, these active materials serving as the luminescent center. A glass substrate 6 provides a support for the stratified construction. Such EL element provides electroluminscent light emission upon application of voltage higher than the threshold level.

Recently, the inventors have discovered the new phenomenon that electrically polarized charges occur at the interfaces between the ZnS electroluminescent layer 1 and the dielectric layers 2, 3 upon light excitation under the conditions where such EL element is biased by a relatively low DC voltage or DC offset voltage and accordingly a light-excited polarized electric field occurs within the electroluminescent layer 1. The present invention is mainly dependent upon the discovery.

The light-excited electrical polarization effect of the ZnS (Mn) thin film EL element will be described in more detail together with the method for activating the EL element.

Figure 2:
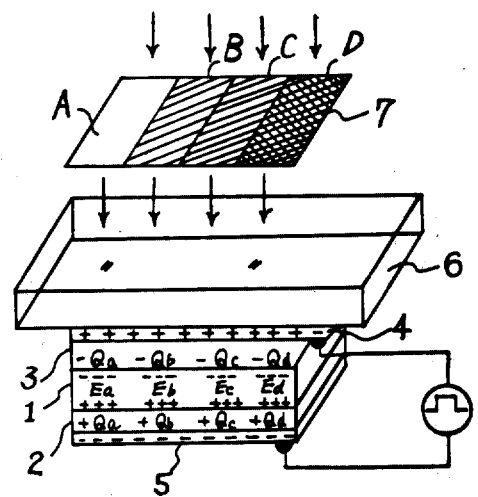
FIG. 2 is an illustration of a first embodiment of the present invention.

In FIG. 2, a photo-image is projected through a pattern 7 on the substrate 6 of the ZnS thin film EL element of a three-layer construction. For example, the pattern 7 has four regions A, B, C and D of different brightness and thus the respective regions have different light transmission factors. It will be noted from FIG. 2 that the amounts $Ij$ ($j=a, b, c, d$) of light transmission through these regions are correlated under $Ia>Ib>Ic>Id$. The relatively low DC voltage or DC offset voltage is applied across the electroluminscent element by means of the pair of electrodes 4, 5. The application of DC voltage and the projection of photo-image result in the occurrence of polarization charges $Qa$, $Qb$, $Qc$ and $Qd$ in the dielectric layers 2, 3 in accordance with the light transmission amount $Ij$ and hence the formation of polarization electric fields $Ea$, $Eb$, $Ec$, $Ed$ within the ZnS electroluminescent layer 1. The polarized electric field establishes in the opposite direction to the external applied electric field. The light-excited polarized electric charge $Qj$ can be represented as follows:

$$Qj = \alpha c\, v_o (1 - e^{-\beta\, Ijt}) \quad (1)$$

Where $\alpha$: the constant determined by thin film construction and deposition conditions, $\beta$: the constant dependent upon light wavelength spectrum, $c$: the capacitance between the electrodes, $v_o$: the external applied voltage, $Ij$ ($j=a, b, c, d$): the exposure amount per a unit time period, and $t$: the exposure period. Analysis of the formula (1) shows that the amplitude $Qj$ of the polarization charge increases in accordance with an increase in the light amount ($Ij \times x$). Accordingly, the relations $Qa>Qb>Qc>Qd$ exist between the light-excited electric charges on the respective regions and, needless to say, the corresponding relations $Ea>Eb>Ec>Ed$ exist between the individually polarized electric fields. Such electro-optical behavior is called the light-excited electrical polarization effect. Since the polarization charge amplitude corresponds to the degree of light exposure, a desired photo-image can be written into the EL element in the form of a polarized latent image.

Moreover, the inventors have clarified the fact that the thus obtained light-excited electrical polarization charges are maintained in a dark room for a relatively long period of time (e.g., several tens hours to several hundreds hours) even after completion of voltage excitation. In other words, the element has the memorizing functions and the light-excited polarized charges $\pm Qa$, $\pm Qb$, $\pm Qc$, $\pm Qd$ illustrated in FIG. 2 remain in the dark room even after completing the application of the external electric field.

Figure 3:
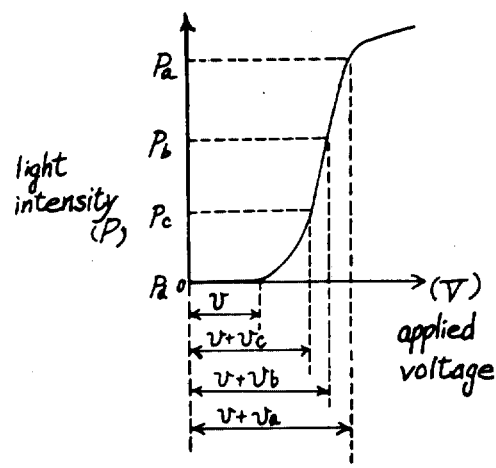
FIG. 3 is a graph showing light emission output versus applied voltage characteristics of the element of FIG. 1.

In order to read out the photo-image memorized on the EL panel, a predetermined voltage $v$ sufficient to cause luminescence should be externally supplied to the EL element. FIG. 3 illustrates the luminescence intensity versus applied voltage characteristic curve in the three-layer construction ZnS EL element. It will be clear from this drawing that the light intensity varies in correspondence with applied voltage within a range over a given voltage value (i.e. threshold level). Therefore, providing that the external applied voltage $v$ for the purpose of reading out the latent image is correlated as shown in FIG. 3 with the equivalent voltages $v_a$, $v_b$, $v_c$, $v_d$ of the light-excited electric fields $Ea$, $Eb$, $Ec$, $Ed$, the EL element will show luminescent of which the amount corresponds to the light-excited polarized electric field. The result is the reproducing or copying of the originally-written image.

Figure 4:
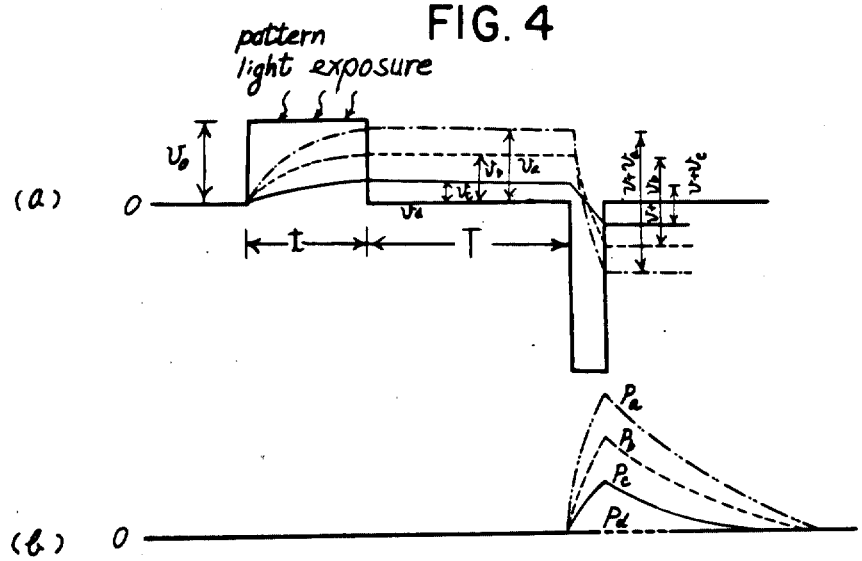
FIG. 4 is a time chart for the purpose of explanation of the first embodiment of FIG. 2.

FIG. 4(a) shows applied voltages to the EL element and the electric field within the EL layer while FIG. 4(b) shows the light emission from the EL element. In the drawings the period where the external voltage is applied for the purpose of writting the image into the EL element, is denoted as $t$, and the period where the written image is maintained, is denoted as T. In the illustrative embodiment of FIG. 4 the voltage pulses for the write mode ae chosen opposite as regards the polarity to that for the read mode. This is due to the fact that the internal polarization electric field created upon voltage excitation for the write mode has the opposite polarity to the voltage excitation and thus as shown in FIG. 4(a) the electric field upon the application of the read mode pulses are superimposed on the already formed internal polarization electric field. With such arrangement stronger light emission may be obtained by means of lower read pulses.

Conversely, the application of the application of the same polarity pulses in the read mode produces the result of cancellation between the applied voltage and the internal electric field ad the substantial applied voltages across the individual portions of the EL element are $v-v_a$, $v-b$, $v-v_c$ and $v-v_d$. Therefore, the voltage excitation of the opposite polarity is more useful rather than the same polarity excitation as regards the reading out operations.

As discussed above, in the case where the read pulses have the opposite polarity to the write pulses, the voltages substantially applied across the EL element at the individual points are $v+v_a$, $v+v_b$, $v+v_c$ and $v+v_d$ respectively, and thus the read out image is positive. If the polarity of the read pulses is identical with that of the write pulses, the equivalent voltage values at the individual points are $v-v_a$, $v-v_b$, $v-v_c$, and $v-v_d$ respectively and the read out image is negative because of the correlations $v_a>v_b>v_c>v_d$; and $(v-v_a)<(v-v_b)<(v-v_c)<(v-v_d)$.

Figure 5:
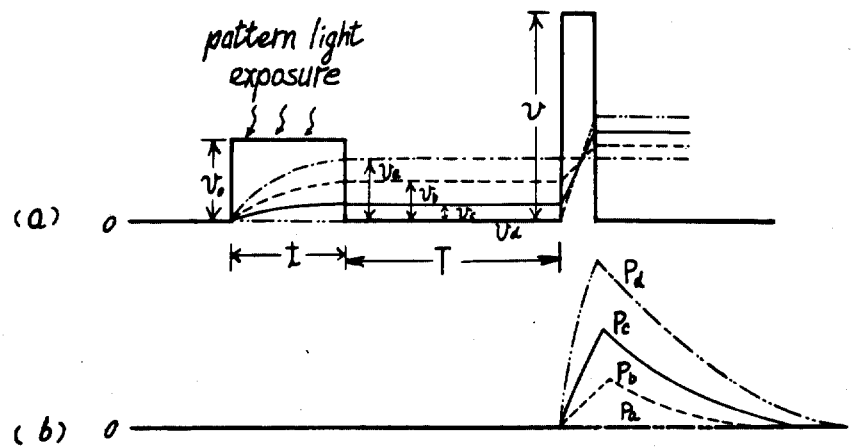
FIG. 5 is a time chart showing a modification of the first embodiment of FIGS. 2 and 4.

FIG. 5(a) shows applied voltage to the EL element and electric field occurring within the EL layer and FIG. 5(b) showing light emission of the EL element in the case where the read and write pulses have the same polarity. It will be understood from these drawings that light onputs $Pa$, $Pb$, $Pc$, $Pd$ corresponding to the individual regions A, B, C, D are correlated as $Pa<Pb<Pc<Pd$.

Although the write and read modes are carried on due to the light-excited electrical polarization effects when the DC voltage is applied to the EL panel in the above illustrated embodiment, the same can be effected by using a DC offset pulse as herein defined to mean alternating pulses having a DC offset component.

Figure 6:
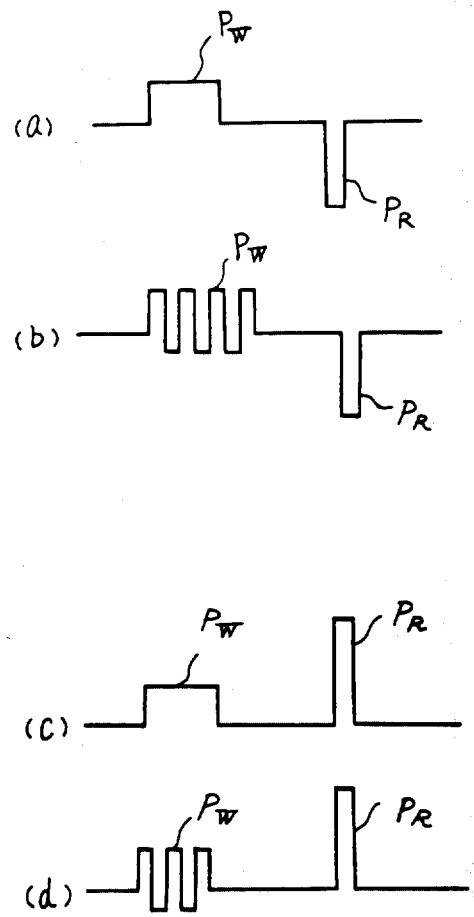
FIG. 6 is a time chart showing the first embodiment inclusive the modification illustrated in FIG. 5.

FIG. 6(a) through 6(d) show embodiments inclusive a second embodiment which utilizes the DC offset pulses, wherein Pw and $P_R$ represent the write pulses and read pulses respectively. FIG. 6(a) illustrates the above embodiment described in connection with FIG. 4 and FIG. 6(b) illustrates a modification using the DC offset pulses as the write pulses Pw. In both examples, the photo image written into the EL element is a positive image and the read out image also is a positive image.

FIG. 6(c) illustrates another example wherein application of the DC voltage PW enables the writing of a positive image the subsequent application of the DC voltage $P_R$ having the same polarity as that of the write pulse Pw causes the reverse image to be obtained.

As noted earlier, the polarized charges stored on the EL element remain in the dark room for a relatively longer period of time, for example, several hours to several tens hours, Nevertheless, under these circumstances light excitation may shorten greatly the storage time period. In other words, the light excitation causes the internal polarization charge Q to be reduced. The process of such depolarization can be represented as follows:

$$Q' = ac\, v_e\, e^{-\beta' l' t'} \qquad (2)$$

Where $Q'$: the amplitude of the residual internal charge, $\beta$: the constant relating to the wavelength of the excitation light during the depolarization process, $l'$: the excitation intensity during the dipolarization process and $t'$: the exposure period. Analysis of the above formula (2) shows that the internal polarization charge Q formed due to the light-excited electrical polarization effects is reduced in accordance with an increase of the light exposure amount ($l' \times t'$) attributable to the depolarization effects.

Figure 7:
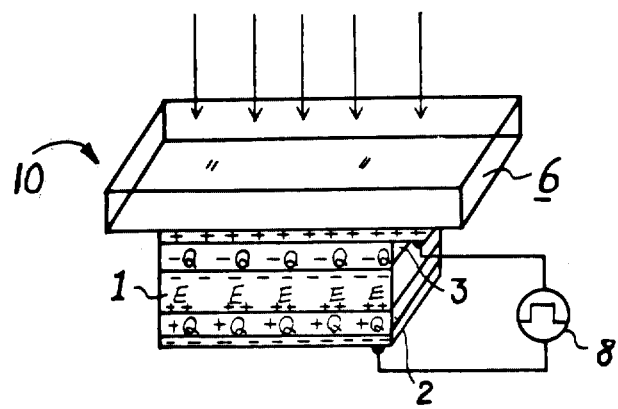

Therefore, in order to form a desired pattern on the EL element, as illustrated in FIG. 7, light excitation of flat intensity is first effected on the electroluminescent panel generally designated 10 when the EL element is biased by the constant DC voltage or DC offset voltage so as to create an uniformly polarized electric field. Thereafter, no voltage is applied to the EL element. Furthermore, as illustrated in FIG. 8, the image to be written into the projected through the pattern 9 in a manner to develop the residual charge distribution corresponding to the transmission light amount through the EL panel 10.

The residual charges remain at the respective zones of the EL panel 10 corresponding to the different brightness areas A, B, C, D of the pattern 9 in dependence upon the amount $I_j$ ($j = a, b, c, d$) of light transmission as follows:

$$Q_j = ac\, v_e\, e^{-\beta' l' x'} \qquad (3)$$

The formula (3) shows the relation $Q_a < Q_b < Q_c < Q_d$ under the assumption that $I_a' > I_b' > I_c' > I_d'$.

The following embodiment is to utilize the light-excited electrical depolarization effects in writing the photo image into the EL panel 10. That is, the photo-image from the pattern 9 is written as the residual charges Qj into the EL panel 10 during the depolarization mode and then maintained in the dark room. The photo image is written as the negative image because the polarization latent image is expressed as $Q_a < Q_b < Q_c < Q_d$.

After writting and memorizing the image on the EL plane 10, the subsequent application of the predetermined voltage pulse for the read mode results in light emission from the EL panel in correspondence with the polarization electric field distribution and hence the written and memorized image.

The mode of writing, memorizing and reading the image will be now discussed with reference to FIG. 9(a) showing the applied voltages to the ZnS EL panel for the write, storage and read modes and the internal polarization charge amplitude within the EL panel and FIG. 9(a) showing the light emission from the EL element. In thise illustrations Pw represents DC voltage or DC offset pulses which are applied to the EL panel 10 for the period $t$ in a manner to form a uniformly polarized charge distribution. At this time uniform light exposure is applied to the EL panel 10. The curve $e$ represents the electric field indicative of the internal polarization charge. The application of the photo image is carried on for the period $t'$ after the forming the uniform charge Q on the EL panel 10, and as a result the internal fields at the individual zones are reduced to $v_a, v_b, v_c, v_d$ respectively.

Figure 9:
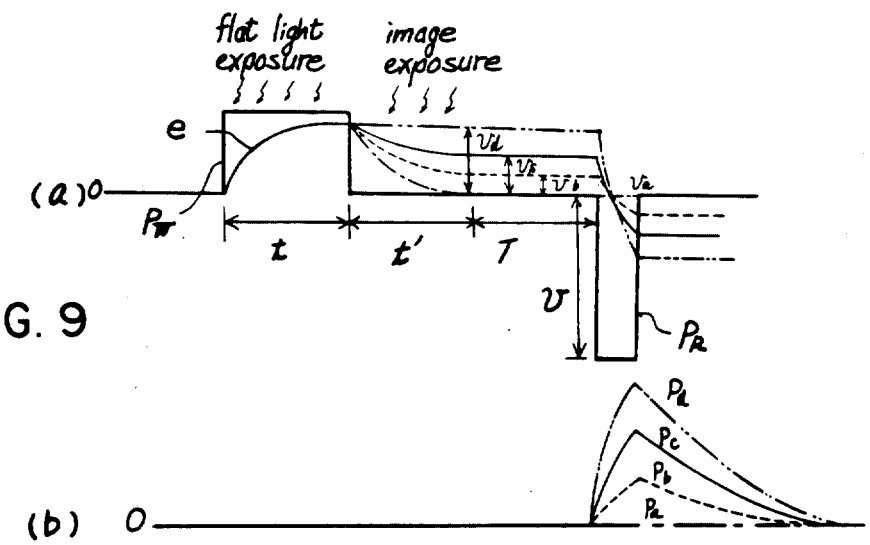
FIG. 9 is a time chart relating to the second embodiment.

In the FIG. 9 embodiment the read pulse $P_R$ has the opposite polarity to the pulse Pw for causing the polarization and thus the electric field due to the read pulse $P_R$ is supperimposed on the already existing internal polarization electric field as previously discussed. When the voltage value V of the read pulse $P_R$ is denoted as $v$, the voltage value substantially developed at the individual zones A, B, C, D of the panel 10 as shown in FIG. 8 are respectively $v+v_a$, $v+v_b$, $v+v_c$ and $v+v_d$. Because $v_a < v_b < v_d$ and thus $(v+v_a) < (v+v_b) < (v+v_c) < (v+v_d)$ as shown in FIG. 9(a), the light outputs Pa, Pb, Pc, Pd at the individual zones A, B, C, D are correlated as Pa and Pb Pc Pd as viewed from FIG. 9(b). That is, the read out image is the negative image. Conversely, if the read pulse $P_R$ has the same polarity as the pulse Pw for depolarization formation, the individual light outputs Pa, Pb, Pc, Pd are correlated in the relation of Pa>Pb>Pc>Pd and the image is read out in the form of the positive image. The concept illustrated with reference to FIGS. 6(a) through 6(d) is applicable to the embodiment utilizing the light-excited electrical depolarization effects in writting the image into the EL panel.

Figure 10:
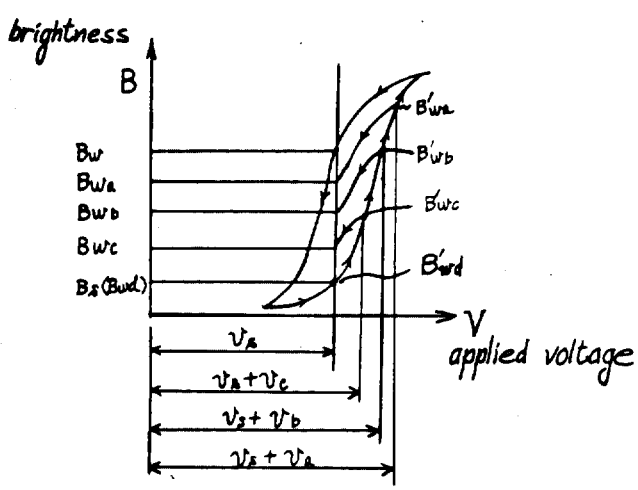
FIG. 10 is a graph showing hysteresis properties included within light intensity versus applied voltage characteristics of the electroluminescent element.

The various embodiments discussed above are adapted to display the memorized image in response to application of a single read pulse so that the photoimage is displayed in the form of light emission for an instant. However, the hysteresis behavior within the light intensity versus applied voltage characteristics inherent in the sandwich type thin film EL element enables consecutive display of the read out image. The material of the dielectric layers 2, 3 and manufacturing factors for the EL elements are appropriately selected so as to exhibit the hysteresis phenomenon within the ZnS (Mn) thin film EL element. FIG. 10 shows the hysteresis phenomenon wherein the axis of ordinates is graduated by the light intensity B while the axis of abscissas is graduated by the peak value V of the applied alternating voltage pulse. To utilize effectively the hysteresis loop characteristics, a string of alternating pulses Ps is selected, the peak value thereof being at the voltage level Vs appearing at the point where the difference between the maximum light brightness Bw and the minimum light brightness Bs is considerably large and the thus selected pulses Ps are supplied to the panel 10 instead of the read pulse $P_R$ as shown in FIG. 11(a). The result is that the electric field due to these pulses Vs is superimposed on the internal polarization fields $v_a$, $v_b$, $v_c v_d$ to provide light emission at the intensities B'wa, B'wc, B'wd. These intensities decrease along the hysteresis loop in accordance with changes in the pulse voltage Ps. The light emission is maintained at the stable intensities Bwa, Bwb, Bwc, Bwd as for the voltage level Vs. Consequently, the image is consecutively displayed during the application of the pulse string Ps. FIG. 11(b) illustrates light emission at the respective zones A, B, C, D of the EL panel 10.

Figure 11:
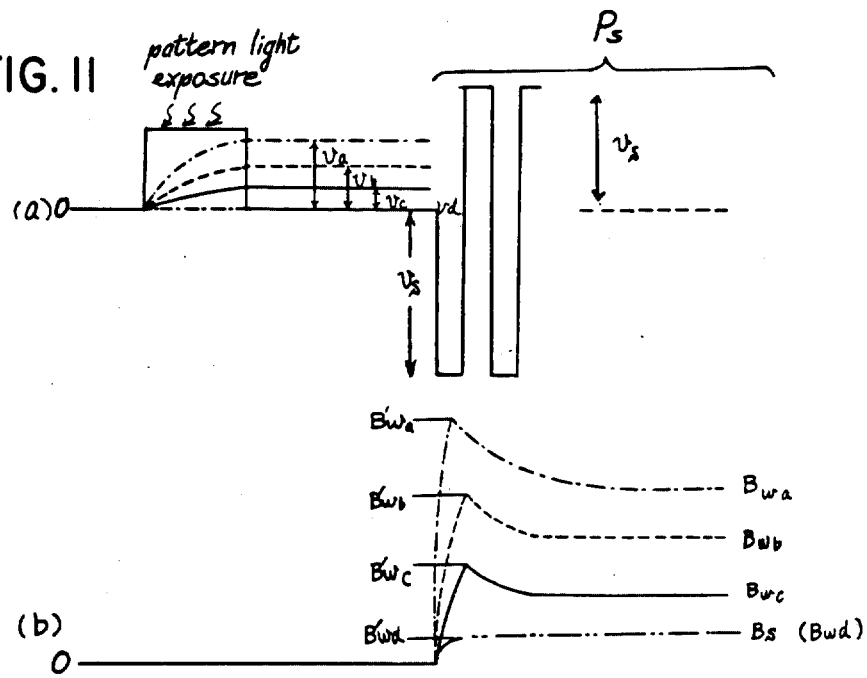

Moreover, as illustrated in FIG. 12, consecutive display of the image is possible by means of the pulse string Ps in the case where an image is written by utilization of the light-excited electrical depolarization effects. The read out image in FIG. 11 is the positive image whereas that in FIG. 12 is the negative image. The pulse string Ps may have any duty cycle.

Partial revision of the written image is made possible by employing the light-excited electrical depolarization effects.

That is, light exposure is applied only to the portion desired to be revised and then the electrical polarization amount thereon is controlled in a manner to revise the latent image.

The invention being thus described, it will be obvious that the same may be varied in many ways. Such variations are not to be regarded as a departure from the spirit and scope of the invention, and all such modifications are intended to be included within the scope of the following claims.

We claim:

1. An electro-optical device of the type which exhibits luminescence comprising:
   an electroluminescent layer:
   a pair of dielectric layers, said electroluminescent layer being sandwiched between the pair of the dielectric layers;
   a pair of electrodes;
   said pair of dielectric layers and said electroluminescent layer being sandwiched between said pair of electrodes;
   means for creating light-excited electric polarization effects at the dielectric layers by means of light excitation and application of bias voltage; and
   means for applying a voltage across said electrodes of a sufficient level to cause electroluminescence of said electroluminescent layer.

2. The device as set forth in claim 1 wherein said electroluminescent layer comprises Mn doped ZnS.

3. The device as set forth in claim 2 wherein said dielectric layers comprise $Y_2O_3$.

4. The device as set forth in claim 3 wherein the light intensity versus applied voltage characteristics of said electroluminescent layer exhibits hysteresis properties.

5. An electroluminescent image storage and display device comprising:
   a three layered sandwiched structure including an electroluminescent layer having a given threshold level for initiating electroluminescence therein and a pair of dielectric layers for sandwiching said electroluminescent layer therebetween;
   a pair of electrodes for supporting said sandwiched structure therebetween;
   means for applying a DC bias voltage having a level which is less than said given threshold level to said electrodes and thus across the electroluminescent layer and said dielectric layers;
   means for applying a light pattern to said display panel when in the DC biased condition to provide the formation of an electrical polarization charge pattern corresponding to said light pattern about the interfaces between said electroluminescent layer and said dielectric layer due to said application of light, the light excited electrical polarization charge pattern being sustained by the inherent memory effects of said sandwiched structure; and
   means for applying at least one voltage pulse across said electrodes which is higher than said given threshold level across said electroluminescent layer for creating luminescent light emission in accordance with said electrical polarization charge pattern in the interfaces between said electroluminescent layer and said dielectric layers and thus reading out the internal charge pattern in the form of light emission.

6. The device as set forth in claim 5 wherein said electroluminescent layer comprises Mn doped ZnS.

7. The device as set forth in claim 6 wherein said dielectric layers comprises $Y_2O_3$.

8. The device as set forth in claim 5 wherein the light intensity versus applied voltage characteristics of said electroluminescent layer exhibits hysteresis properties.

9. The device as set forth in claim 5 further including means for illuminating said three layered sandwiched structure with light of substantially uniform intensity across at least one face of said structure.

10. An electro-optical device of the type which exhibits electroluminescence comprising a thin-film electroluminescent layer, a pair of thin-film dielectric layers, said thin-film electroluminescent layer being sandwiched between the pair of the thin-film dielectric layers, a pair of electrodes deposited on the thin-film dielectric layers for receipt of a voltage of sufficient level to cause electroluminescence of said thin-film electroluminescent layer and means for creating an electrical polarization charge pattern about the interfaces between said thin-film electroluminescent layer and said thin-film dielectric layers, said electro-optical device characterized in that said three-layer thin-film sandwiched structure is of the type which holds and sustains the thus created electrical polarization charge pattern by the inherent memory effects of said sandwiched.

11. The electro-optical device as set forth in claim 10, wherein said electrical polarization charge pattern creating means comprise means for applying light exposure to said thin-film electroluminescent layer via said three-layer thin-film sandwiched structure to create an electrical polarization charge pattern about the interfaces between said thin-film electroluminescent layer and said thin-film dielectric layers.

12. The electro-optical device as set forth in claim 10, further comprising means for erasing the electrical polarization charge pattern create about the interfaces between said thin-film electroluminescent layer and said thin-film dielectric layers, by applying light exposure to said thin-film electroluminescent layer via said three-layer thin-film sandwiched structure.

* * * * *